(12) United States Patent
Lee et al.

(10) Patent No.: US 9,070,815 B2
(45) Date of Patent: Jun. 30, 2015

(54) PHOTONIC DEVICE

(71) Applicant: SAMSUNG ELECTRONICS CO., LTD., Suwon-si, Gyeonggi-do (KR)

(72) Inventors: Kwang-hyun Lee, Hwasung (KR); Dong-jae Shin, Hwasung (KR); Ho-chul Ji, Hwasung (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 15 days.

(21) Appl. No.: 13/924,487

(22) Filed: Jun. 21, 2013

(65) Prior Publication Data
US 2014/0055838 A1 Feb. 27, 2014

(30) Foreign Application Priority Data

Aug. 23, 2012 (KR) .................. 10-2012-0092543

(51) Int. Cl.
| | | |
|---|---|---|
| *G02F 1/01* | (2006.01) | |
| *G02B 26/00* | (2006.01) | |
| *G02F 1/03* | (2006.01) | |
| *G02B 26/08* | (2006.01) | |
| *G02F 1/035* | (2006.01) | |
| *G02F 1/295* | (2006.01) | |
| *H01L 31/105* | (2006.01) | |
| *G02F 1/015* | (2006.01) | |
| *G02F 1/025* | (2006.01) | |
| *G02F 1/225* | (2006.01) | |

(52) U.S. Cl.
CPC .............. *H01L 31/105* (2013.01); *G02F 1/015* (2013.01); *G02F 1/025* (2013.01); *G02F 1/2257* (2013.01)

(58) Field of Classification Search
CPC ... G02F 2203/50; G02F 1/2255; G02F 1/225; G02F 1/3132; G02F 1/035; G02F 1/29; G02F 1/03; G02F 1/055; G02F 1/025; H04B 10/505; G02B 26/0841; B82Y 20/00
USPC ......... 359/278–279, 315, 245, 247, 251–252, 359/254, 108, 237–238, 290–292, 298, 359/300–302; 385/1–3, 40, 129–132, 5, 385/8–9
See application file for complete search history.

(56) References Cited

U.S. PATENT DOCUMENTS

| | | | | |
|---|---|---|---|---|
| 4,884,119 A | * | 11/1989 | Miller | .............................. 257/14 |
| 5,783,844 A | * | 7/1998 | Kobayashi et al. | ............ 257/103 |
| 6,999,670 B1 | | 2/2006 | Gunn et al. | |
| 7,402,865 B2 | | 7/2008 | Ipposhi et al. | |
| 8,043,906 B2 | * | 10/2011 | Beach | ............................ 438/172 |
| 2005/0123242 A1 | * | 6/2005 | Walker et al. | .................... 385/40 |

(Continued)

FOREIGN PATENT DOCUMENTS

| | | |
|---|---|---|
| JP | 2001168352 A | 6/2001 |
| JP | 2005064166 A | 3/2005 |
| JP | 2005250267 A | 9/2005 |
| KR | 100575622 B1 | 5/2006 |

(Continued)

*Primary Examiner* — Dawayne A Pinkney
(74) *Attorney, Agent, or Firm* — Renaissance IP Law Group LLP

(57) ABSTRACT

A photonic device is provided. The photonic device includes: a semiconductor layer including first and second regions; an insulating layer covering the semiconductor layer; and first and second plugs extending to pass through the insulating layer and electrically connected to the corresponding first and second regions. The first plug is in a rectifying contact with the first region, and the second plug is in an ohmic contact with the second region.

20 Claims, 17 Drawing Sheets

(56) References Cited

U.S. PATENT DOCUMENTS

2011/0042775 A1 2/2011 Doi et al.
2011/0135243 A1 6/2011 Park et al.
2011/0210337 A1 9/2011 Briere
2011/0243492 A1 10/2011 Na et al.

FOREIGN PATENT DOCUMENTS

| | | |
|---|---|---|
| KR | 20060122259 A | 11/2006 |
| KR | 20070071024 A | 7/2007 |
| KR | 101035599 B1 | 5/2011 |
| KR | 101066436 B1 | 9/2011 |

* cited by examiner

PHOTONIC DEVICE

CROSS-REFERENCE TO RELATED APPLICATIONS

This application claims the benefit of Korean Patent Application No. 10-2012-0092543, filed on Aug. 23, 2012, in the Korean Intellectual Property Office, the disclosure of which is incorporated herein in its entirety by reference.

BACKGROUND

Embodiments relate to a photonic device, and more particularly, to a photonic device that is suitable for higher-speed operation and is easily manufactured.

Due to increasing demands for higher integration and large capacity electronic devices and increased use of multimedia information, photonic integrated circuits (PIC) using optical interconnections for communication between various components within a system are being used in a wide range of applications. A PIC conveys information as optical signals rather than electrical signals and includes a photonic device, such as an electro-optic modulator for converting an electrical signal to an optical signal, and a photonic device such as an optical receiver for converting an optical signal into an electrical signal. The electro-optic modulator and the optical receiver generally use diode-type electrodes to convert an electrical signal to an optical signal and vice versa.

SUMMARY

An embodiment includes a photonic device comprising: a semiconductor layer including first and second regions; an insulating layer covering the semiconductor layer; and first and second plugs extending to pass through the insulating layer and electrically connected to the corresponding first and second regions. The first plug is in a rectifying contact with the first region, and the second plug is in an ohmic contact with the second region.

An embodiment includes a system, comprising: at least one electro-optical modulator configured to modulate an optical signal to generate a modulated optical signal; wherein each electro-optical modulator includes a phase shifter comprising: a semiconductor layer including first and second regions; an insulating layer covering the semiconductor layer; and first and second plugs extending to pass through the insulating layer and electrically connected to the corresponding first and second regions. The first plug is in a rectifying contact with the first region, and the second plug is in an ohmic contact with the second region.

An embodiment includes a method, comprising: forming a semiconductor layer including first and second regions on a substrate; doping the second region; forming a rectifying contact with the first region; and forming an ohmic contact with the second region.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Example embodiments of the invention will now be described more fully hereinafter with reference to the accompanying drawings, in which exemplary embodiments of the invention are shown. This invention may, however, be embodied in many different forms and should not be construed as limited to the exemplary embodiments set forth herein. Rather, the exemplary embodiments are provided so that this disclosure will be thorough and complete, and will fully convey the scope of the invention to those skilled in the art. The scope of the present invention is defined only by the appended claims. Like numbers refer to like elements throughout.

The terminology used herein is for the purpose of describing particular exemplary embodiments only and is not intended to limit the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, integers, steps, operations, elements, components and/or groups thereof, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements that may be present. As used herein, the term "and/or" includes any and all combinations of one or more of the associated listed items.

It will be understood that, although the terms 'first', 'second', etc. may be used herein to describe various elements, components, and/or sections, these elements, components, and/or sections should not be limited by these terms. These terms are only used to distinguish one element, component, or section from another element, component, or section. For example, "a first element," "component," or "section" discussed below could be termed a second element, component, or section without departing from the teachings of the disclosure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
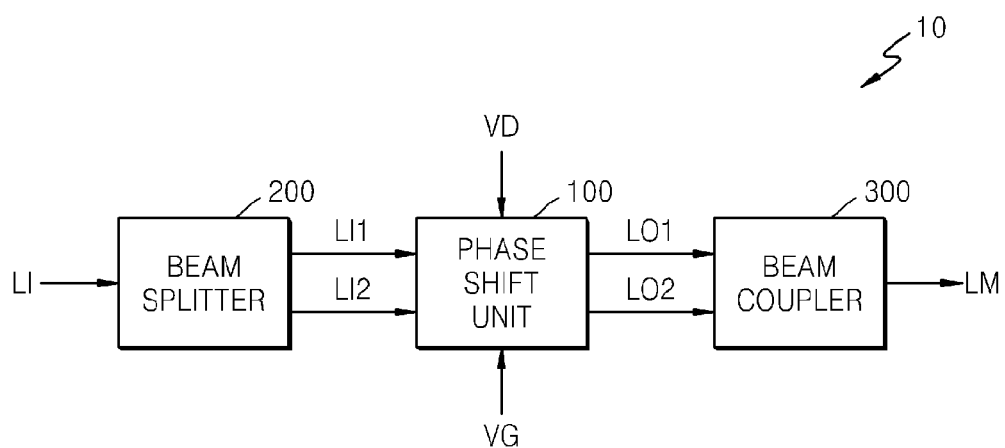
FIG. 1 is a schematic block diagram of an electro-optic modulator including a phase shift unit used as a photonic device according to an embodiment of the present invention.

FIG. 1 is a schematic block diagram of an electro-optic modulator 10 including a phase shifter as a photonic device according to an embodiment of the present invention. In general, electro-optic modulators are classified into electro-absorption modulators and interferometer modulators. An interferometer modulator splits an input optical signal, modulates a phase of at least one optical signal, and outputs a modulated optical signal using destructive and constructive interferences between the phase-maintained signal and phase-modulated signal. The interferometer modulator having the above configuration is called a Mach-Zehnder interferometer modulator. While it is assumed hereinafter that the electro-optic modulator 10 is Mach-Zehnder interferometer modulator, other types of modulators may be used.

Referring to FIG. 1, the electro-optic modulator 10 includes a beam splitter 200, a phase shift unit 100, and a beam coupler 300. The beam splitter 200 is configured to split an optical signal LI received from the outside, e.g., a light source (not shown) into first and second optical signals LI1 and LI2 and transmits the first and second optical signals LI1 and LI2 to the phase shift unit 100. The phase shift unit 100 is configured to maintain a phase of the first optical signal LI1 and outputs a first output optical signal LO1. The phase shift unit 100 is also configured to shift a phase of the second optical signal LI2 in response to first and second electrical signal received from the outside, e.g., an electrical signal generator (not shown) and outputs a second output optical signal LO2. The first and second electrical signals may be a modulated supply voltage VD and a ground voltage VG, respectively. The beam coupler 300 is configured to combine the first and second output optical signals LO1 and LO2 and output a modulated optical signal LM. The operation and configuration of various embodiments of the beam splitter 200, the phase shift unit 100, and the beam coupler 300 are described in more detail below.

Figure 2:
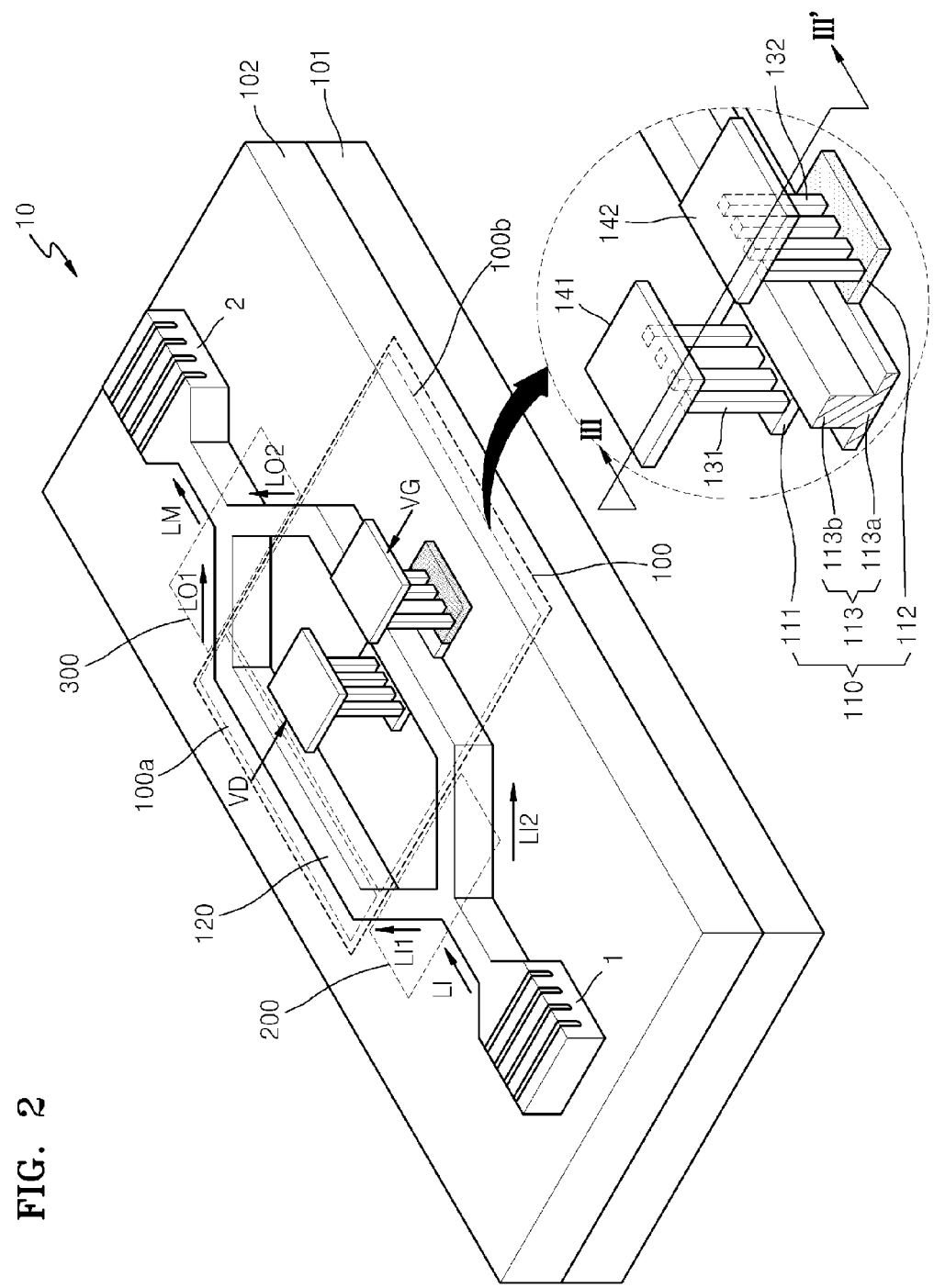
FIG. 2 is a detailed perspective view of the electro-optic modulator of FIG. 1 according to an embodiment of the present invention.

FIG. 2 is a detailed perspective view of the electro-optic modulator 10 of FIG. 1 according to an embodiment of the present invention. Referring to FIG. 2, for convenience of explanation, the electro-optic modulator 10 is disposed on a lower insulating layer 102 overlying a semiconductor substrate 101. The electro-optic modulator 10 further includes an input grating coupler 1 is configured to receive an optical signal LI from the outside and an output grating coupler 2 is configured to output the modulated signal LM. Although grating couplers have been used as examples, in other embodiments, any optical coupler that may be fabricated on a semiconductor substrate may be used. Furthermore, for convenience, an upper insulating layer between first and second electrode pads 141 and 142 and the lower insulating layer 102 is not shown. The same applies to those which will be described hereinafter with reference to FIGS. 4, 6, and 9.

Referring to FIGS. 1 and 2, the beam splitter 200 is configured to receive the optical signal LI that is used as a medium for optical communications from the input grating coupler 1. The beam splitter 200 is configured to split the optical signal LI into the first and second optical signals LI1 and LI2 having substantially the same phase. The beam splitter 200 is configured to then transport the first and second optical signals LI1 and LI2 to a phase maintainer 100a and a phase shifter 100b of the phase shift unit 100, respectively.

The phase maintainer 100a may be configured as an optical waveguide 120 to output the first output optical signal LO1 to the beam coupler 300 without modulating the phase of the incoming first optical signal LI1.

The phase shifter 100b includes a semiconductor layer 110 having first through third regions 111 through 113, an upper insulating layer (not shown) covering the semiconductor layer 110, the first and second electrode pads 141 and 142, a plurality of first plugs 131 electrically connecting the first region 111 with the first electrode pad 141, and a plurality of second plugs 132 electrically connecting the second region 112 with the second electrode pad 142. Although FIG. 2 shows that the same number of first and second plugs 131 and 132 are disposed at opposite sides of the third region 113, the first and second plugs 131 and 132 are not limited thereto, and may be different in number.

The first region 111 may form a rectifying contact with the first plugs 131 and operate as an electrode to which a first electrical signal VD is applied. The second region 112 may form an ohmic contact with the second plugs 132 and operate as an electrode to which a second electrical signal VG is applied. The third region 113 may operate as a path along which the second optical signal LI2 moves. As shown in FIG. 2, the phase shifter 100b is configured so as to inject charge carriers from the first or second regions 111 and 112 into the third region 113 in response to the first and second electrical signals VD and VG. As a refractive index of the third region 113 changes due to injection of the charge carriers, a phase of the second optical signal LI2 passing through the third region 113 changes and, as a result a phase of the second output optical signal LO2 to the beam coupler 300 changes. The configuration and operation of the phase shifter 100b are described in more detail below with reference to FIGS. 3A and 3B.

The beam coupler 300 is configured to combine the first and second output optical signals LO1 and LO2 and transmits the modulated optical signal LM corresponding to the data to be transmitted to the output grating coupler 2.

Figure 3A:
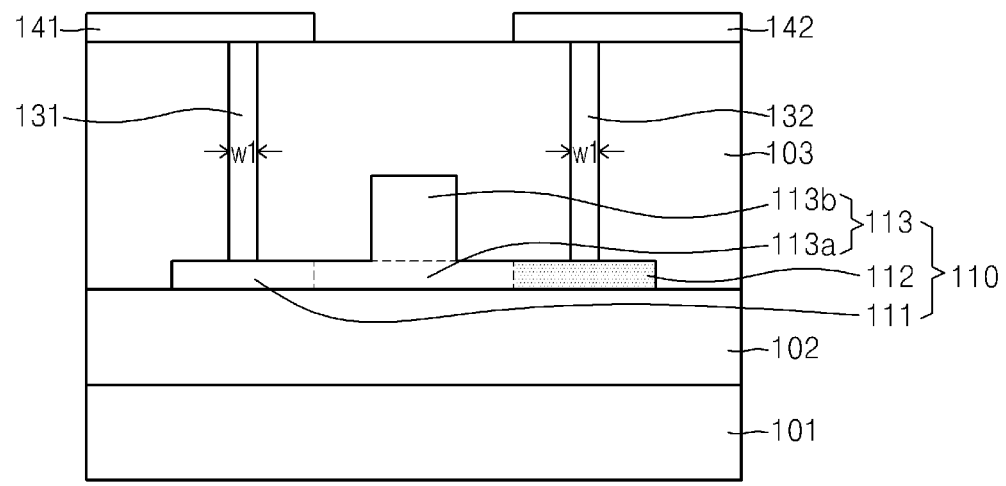
FIGS. 3A and 3B are side sectional views illustrating a phase shifter in the phase shift unit taken along line III-III' of FIG. 2.
Figure 3B:
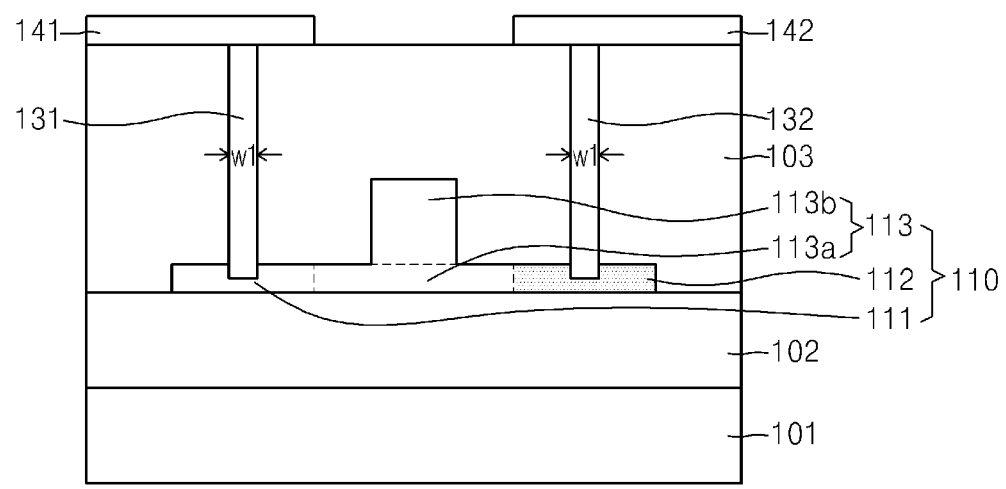

FIGS. 3A and 3B are side sectional views illustrating the phase shifter 100b in the phase shift unit 100 taken along line III-III' of FIG. 2. FIGS. 3A and 3B illustrate contact structures connecting the first and second plugs 131 and 132 to the semiconductor layer 110 in the phase shifter 100b according to embodiments of the present invention. In describing the structure shown in FIG. 3B, the same reference numerals as shown in FIG. 3A denote identical or similar elements, and repeated descriptions with respect to FIG. 3A are omitted to avoid redundancy.

Referring to FIGS. 1, 2, and 3A, the phase shifter 100b includes the semiconductor substrate 101, the lower insulating layer 102, the semiconductor layer 110, an upper insulating layer 103, the first and second plugs 131 and 132, and the first and second electrode pads 141 and 142.

The semiconductor substrate 101 may be a silicon substrate. The lower insulating layer 102 may be disposed over the semiconductor substrate 101. The lower insulating layer 102 may be formed of a silicon oxide.

The semiconductor layer 110 may be disposed on the lower insulating layer 102. The semiconductor layer 110 may be formed of single crystalline silicon. The semiconductor layer 110 may be formed of extrinsic silicon doped with a dopant of a first conductivity type (e.g., P-type) or a second conductivity type (e.g., N-type), or undoped intrinsic silicon.

The semiconductor layer 110 may include the first through third regions 111 through 113. The first and second regions 111 and 112 of the semiconductor layer 110 may be thinner than the third region 113 in order to minimize the loss of the second optical signal LI2. As described below, the first and second regions 111 and 112 may have the same thickness so that an equal number of charge carriers flow from the first or second region 111 or 112 into the third region 113. However, the first and second regions 111 and 112 are not limited thereto, and they may have different thicknesses. Since the third region 113 is thicker than the first and second regions 111 and 112, the semiconductor layer 110 may protrude from one surface of the first or second region 111 or 112, but it is not limited thereto. Although FIG. 3A shows that a first portion 113a of the third region 113 has the same thickness as the first or second region 111 or 112, and a second portion 113b thereof protrudes from a top surface of the first or second region 111 or 112, the semiconductor layer 110 is not limited thereto. For example, the first portion 113a of the third region 113 may have the same thickness as the first or second region 111 or 112 as described above, but the second portion 113b may protrude from a bottom surface of the first or second region 111 or 112. Alternatively, the third region 113 of the semiconductor layer 110 may protrude from both the top and bottom surfaces of the first or second region 111 or 112.

The first region 111 may operate as an electrode to which the first electrical signal VD is applied through the first electrode pad 141 and the first plug 131. In particular, a portion of the top surface of the first region 111 contacts bottom surfaces of the first plugs 131 to form a rectifying contact, i.e., a semiconductor-metal contact exhibiting current-voltage characteristics which allow current to flow under bias in one direction and block it under bias in the opposite direction.

The first region 111 of the semiconductor layer 110 may be an intrinsic region not doped with a dopant of the first or second conductivity type. Alternatively, when the semiconductor layer 110 is doped with the first or second conductivity type dopant so as to have a predetermined charge carrier concentration, the first region 111 may be an extrinsic region of the first or second conductivity type maintaining the charge carrier concentration due to omission of additional doping. In this case, the doping concentration of the first region 111 may be determined considering the type of a metallic material of the first plugs 131 so that the first region 111 maintains a rectifying contact with the first plugs 131.

The second region 112 may operate as an electrode to which the second electrical signal VG is applied through the second electrode pad 142 and the second plug 132. In particular, a portion of the top surface of the second region 112 contacts with bottom surfaces of the second plugs 132 to form an ohmic contact, i.e., a semiconductor-metal contact exhibiting linear current-voltage characteristics.

The entire second region 112 may be doped with a higher concentration of a dopant of the first or second conductivity type. Although FIG. 3A shows that the entire second region 112 is a higher concentration doped region of the first or second conductivity type, it is not limited thereto. The second region 112 may include a higher concentration doped portion of the first or second conductivity type and a low concentration doped portion of the first or second conductivity type, as described below with reference to FIGS. 9 and 10.

The third region 113 may provide a path along which the second optical signal LI2 moves. Charge carriers may flow from the first and second regions 111 and 112 into the third region 113 or vice versa. Due to the flow of the charge carriers into/out of the third region 113, a refractive index of the third region 113 may change so as to modulate a phase of the second optical signal LI2.

The third region 113 may have substantially the same charge carrier concentration as the first region 111. That is, the third region 113 may be an intrinsic region like the first region 111 or an extrinsic region doped with first or second conductivity type dopant so as to have a predetermined charge carrier concentration.

As described above, the first portion 113a of the third region 113 has the same thickness as the first or second region 111 or 112 with the second portion 113b thereof projecting upward. The second portion 113b of the third region 113 may be spaced apart from the first and second plugs 131 and 132 and the first and second electrode pads 141 and 142. The second portion 113b of the third region 113 may be narrower than the first portion 113a thereof in order to prevent loss of the second optical signal LI2 due to doping of the second region 112. In this case, the second portion 113b may be disposed in the center of the first portion 113a, but it is not limited thereto. The second portion 113b may be formed so that an equal number of charge carriers flow from the first or second region 111 or 112 into the third region 113.

The upper insulating layer 103 a may be formed so as to cover the semiconductor layer 110. The upper insulating layer 103 may be a silicon oxide. The upper insulating layer 103 may be sufficiently thin so as to reduce resistance and provide a wide process margin in etching to form the first and second plugs 131 and 132. However, the upper insulating layer 103 may have an appropriate thickness so as to prevent loss in the optical signal traveling to the third region 113. The thickness of the upper insulating layer 103 may be determined by considering that the third region 113 is spaced apart by a predetermined minimum distance (e.g., about 1 um) from the first and second electrode pads 141 and 142.

The first and second plugs 131 and 132 may be electrically coupled to the first and second electrode pads 141 and 142 corresponding to the first and second regions 111 and 112 of the semiconductor layer 110, respectively. The first and second plugs 131 and 132 may be formed in the same process step (See FIG. 8H) and may have the same width w1. The first and second plugs 131 and 132 may have different widths, as described below with reference to FIGS. 6 and 7. The first and second plugs 131 and 132 may have an increasing width in the longitudinal direction, and their bottom surfaces contacting corresponding first and second regions 111 and 112 may have areas larger than those of other surfaces. The first and second plugs 131 and 132 may be formed of a metallic material such as aluminum (Al), copper (Cu), tungsten (W), or the like. As shown in FIG. 2, the first and second plugs 131 and 132 may have a rectangular cross-section. However, in other embodiments, the first and second plugs 131 and 132 may have the one of circular, elliptical, and polygonal cross-sections or have a horizontally extending shape.

The first and second electrode pads 141 and 142 may be configured to receive the first and second electrical signals VD and VG, respectively. The first electrode pad 141 may transmit the first electrical signal VD through the first plugs 131 to the first region 111 of the semiconductor layer 111. Similarly, the second electrode pad 142 may deliver the second electrical signal VG through the second plugs 132 to the second region 112.

Referring to FIGS. 1, 2, and 3B, unlike in the phase shifter 100b shown in FIG. 3A, portions of the first and second plugs 131 and 132 are buried into the first and second regions 111 and 112, respectively. In this case, a bottom surface and a portion of a side surface of the first plug 131 are buried into the first region 111 so as to make an ohmic contact therewith, thereby causing a change in junction capacitance. Likewise, a bottom surface and a portion of a side surface of the second plug 132 are also buried into the second region 112 so as to form an ohmic contact therewith, thereby causing a change in junction capacitance. Thus, by changing the junction structure between the first and second plugs 131 and 132 and the semiconductor layer 110 according to the characteristics of a photonic device required, the characteristics of the phase shifter 100b, such as operation speed, may be controlled.

As described above, in the phase shifter 100b as a photonic device according to an embodiment of the present invention, the first region 111 operating as an electrode forms a rectifying contact with the first plugs 131, thereby permitting higher-speed phase shifting in response to the first electrical signal VD corresponding to data to be transmitted. Higher-speed phase shifting is allowed due to the characteristics of the rectifying contact. That is, since the flow of current is affected by injection of majority charge carriers, the phase shifter 100b does not suffer from time delays resulting from injection and accumulation of minority charge carriers and has low junction capacitance, thereby allowing higher-speed operation.

Furthermore, the phase shifter 100b as a photonic device according to the present embodiment is constructed such that the first region 111 operating as an electrode forms a rectifying contact with the first plug 131, thus eliminating the need for additional doping that is necessary for achieving an ohmic contact across all electrodes. This may simplify the manufacturing process, thereby reducing the manufacturing costs.

Figure 4:
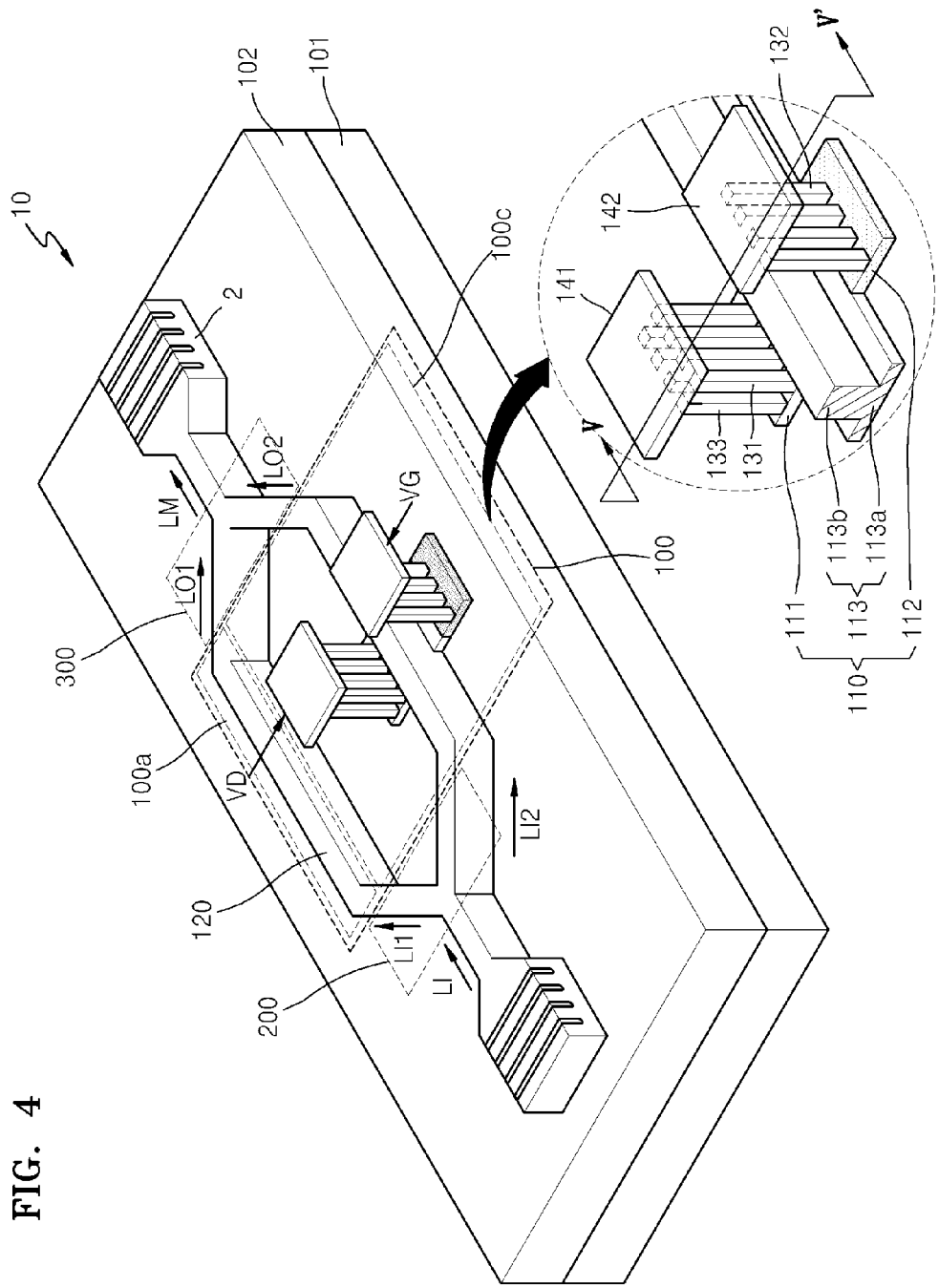
FIG. 4 is a detailed perspective view of the electro-optic modulator of FIG. 1 according to another embodiment of the present invention.
Figure 5:
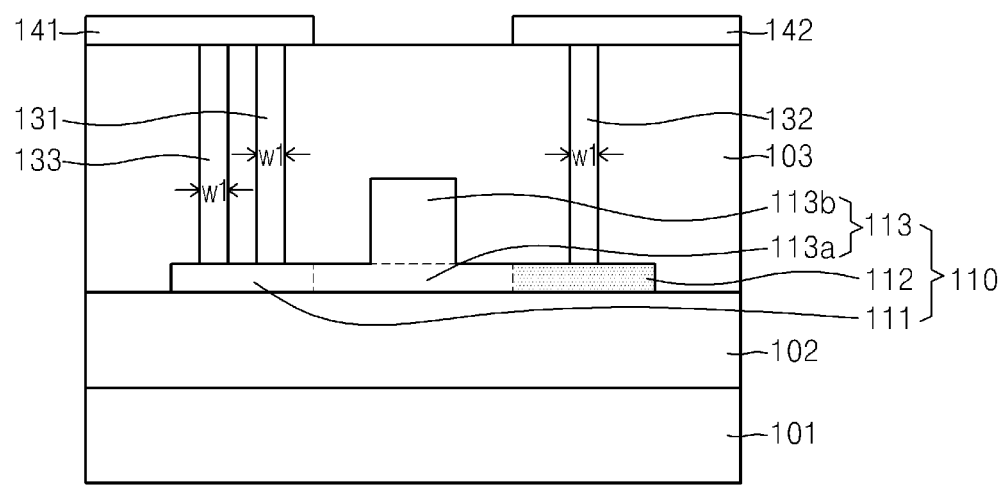
FIG. 5 is a side sectional view of a phase shifter in the phase shift unit taken along line V-V' of FIG. 4.

FIG. 4 is a detailed perspective view of the electro-optic modulator 10 of FIG. 1 according to another embodiment of the present invention. FIG. 5 is a side sectional view of a phase shifter 100c in the phase shift unit 100 taken along line V-V' of FIG. 4. Only the difference from the construction shown in FIGS. 2, 3A, and 3B is described with reference to FIGS. 4 and 5 together with FIGS. 2, 3A, and 3B. The same reference numerals as shown in FIGS. 2, 3A, and 3B denote identical or similar elements, and repeated descriptions with respect to FIGS. 2, 3A, and 3B are omitted to avoid redundancy.

Referring to FIGS. 2 through 5, the phase shift unit 100 includes the phase maintainer 100a and the phase shifter 100c. The phase shifter 100c further includes third plugs 133 electrically connecting the first electrode pad 141 with the first region 111.

Like the first plugs 131, the third plugs 133 are connected to the top surface of the first region 111 so as to form a rectifying contact with the first region 111. Alternatively, a bottom surface and a portion of a side surface of the third plug 133 are buried into the first region 111 so as to make a rectifying contact therewith. The third plugs 133 may be located at the outside of the semiconductor separated from the first plugs 131 and separated from the first plugs 131. The third plugs 133 may be formed in the same process step and have the same width w1 as the first and second plugs 131 and 132. However, the third plugs 133 are not limited thereto, and may have a different width from the first and second plugs 131 and 132. Like the first and second plugs 131 and 132, the third plugs 133 may have various shapes.

The third plugs 133 may be configured to perform a substantially similar function as the first plugs 131, such as changing a junction capacitance while adjusting the characteristics of the phase shifter 100c, such as operation speed, according to the characteristics of a photonic device required. If necessary, the phase shifter 100c may further include plugs performing the same function as the first plug 131 like the third plug 133, wherein the plugs are disposed between the first region 111 and the first electrode pad 141. In this case, the number of plugs added may be appropriately determined considering a width and layout of the first electrode pad 141, the width and layout of the first region 111, or the like.

Figure 6:
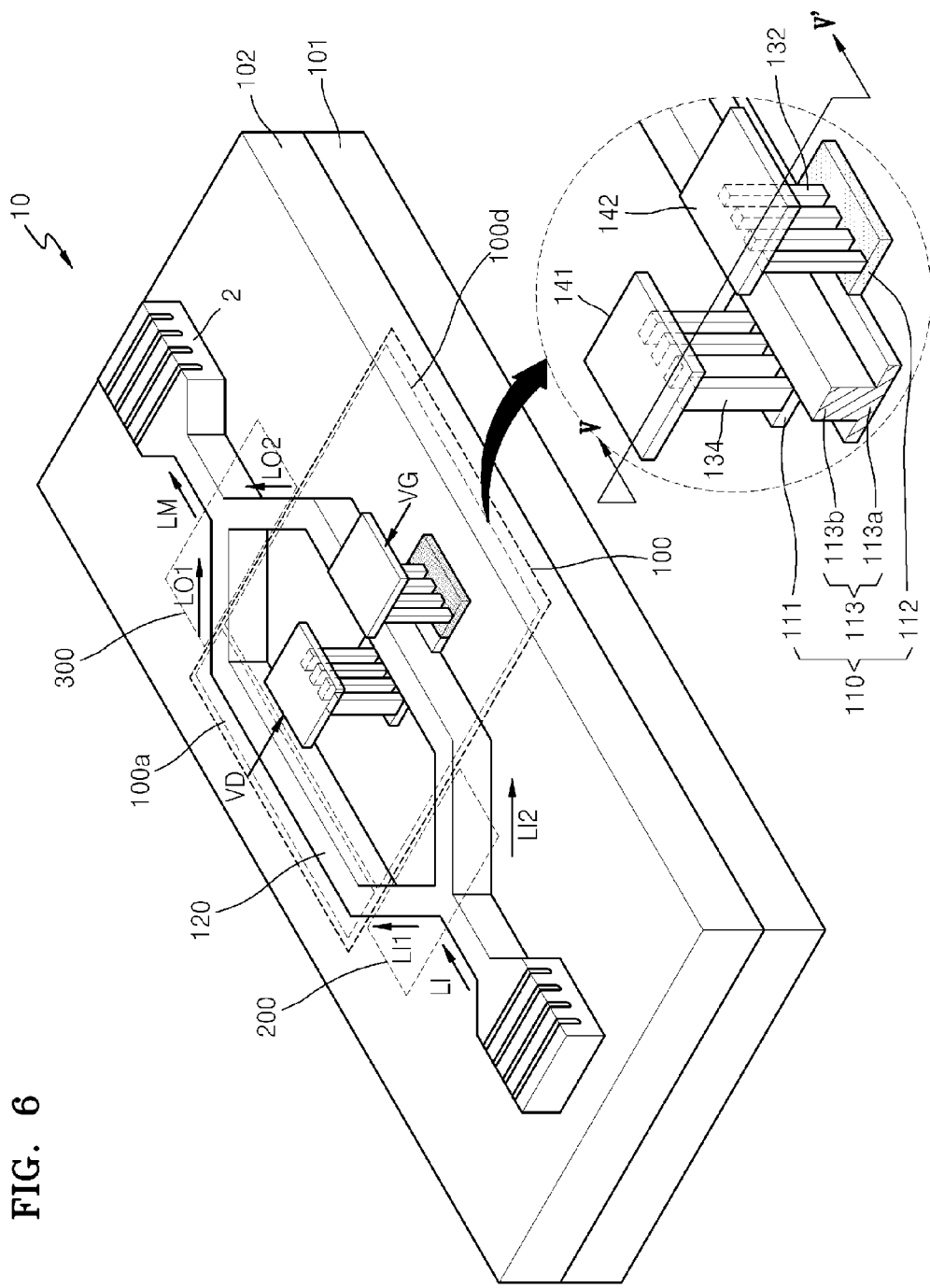
FIG. 6 is a detailed perspective view of the electro-optic modulator of FIG. 1 according to another embodiment of the present invention.
Figure 7:
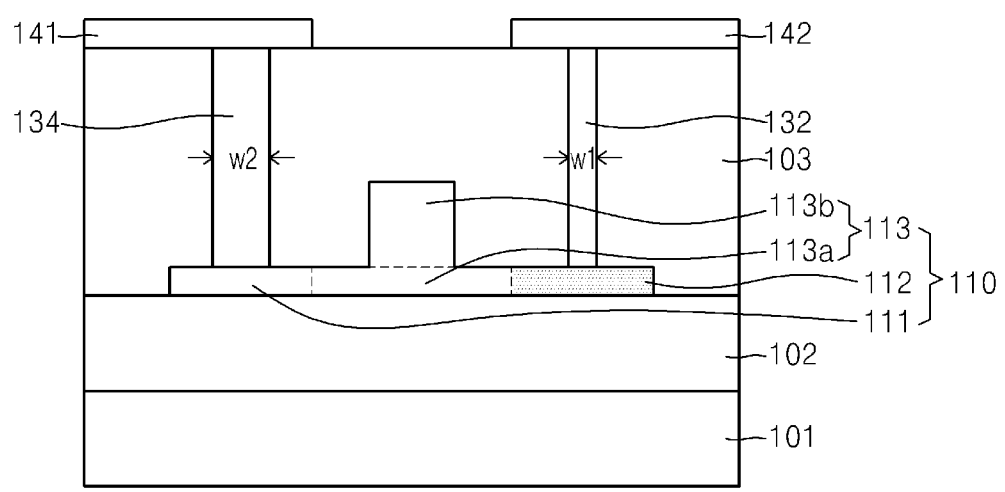
FIG. 7 is a side sectional view of a phase shifter in the phase shift unit taken along line VII-VII' of FIG. 6.

FIG. 6 is a detailed perspective view of the electro-optic modulator 10 of FIG. 1 according to another embodiment of the present invention. FIG. 7 is a side sectional view of a phase shifter 100d in the phase shift unit 100 taken along line VII-VII' of FIG. 6 according to another embodiment of the present invention. Only the difference from the construction shown in FIGS. 2, 3A, and 3B is described with reference to FIGS. 6 and 7 together with FIGS. 2, 3A, and 3B. The same reference numerals as shown in FIGS. 2, 3A, and 3B refer to identical or similar elements, and repeated descriptions with respect to FIGS. 2, 3A, and 3B are omitted to avoid redundancy.

Referring to FIGS. 2, 3A, 3B, 6, and 7, the phase shift unit 100 includes the phase maintainer 100a and a phase shifter 100d. The phase shifter 100d further includes fourth plugs 134, instead of the first plugs 131, electrically connecting the first electrode pad 141 with the first region 111.

The fourth plug 134 may have a different width w2 from the first plug 131. For example, the width w2 of the fourth plug 133 may be greater than the width w1 of the first or second plug 132. Like the first plugs 111, the fourth plugs 134 are connected to the top surface of the first region 111 so as to form a rectifying contact with the first region 111. Alternatively, a bottom surface and a portion of a side surface of the fourth plug 134 are buried into the first region 111 so as to make a rectifying contact therewith. The fourth plugs 134 may be formed in the same or a different process step. Although the fourth plugs 134 have been described as having a different width w2, the fourth plugs 134 may have other dimensions substantially similar to the first and second plugs 131 and 132. Like the first and second plugs 131 and 132, the fourth plugs 134 may have various shapes.

The fourth plugs 134 may be configured to perform substantially the same function as the first plug 131 with a wider width than the first plugs 131, thereby changing a junction capacitance while adjusting the characteristics of the phase shifter 100d, such as operation speed, according to the characteristics of a photonic device required. As shown in FIGS. 4 and 5, the phase shifter 100d may further include plugs configured to perform substantially the same function as the fourth plug 134, wherein the plugs are disposed between the first region 111 and the first electrode pad 141.

FIGS. 8A through 8G are side sectional views sequentially illustrating a method of fabricating a phase shifter as a photonic device, according to an embodiment of the present invention. In particular, FIGS. 8A through 8G illustrate cross-sections of the phase shifter taken along line III-III' of FIG. 2. The embodiments of the present invention are not limited to methods illustrated for description of each step.

Figure 8A:
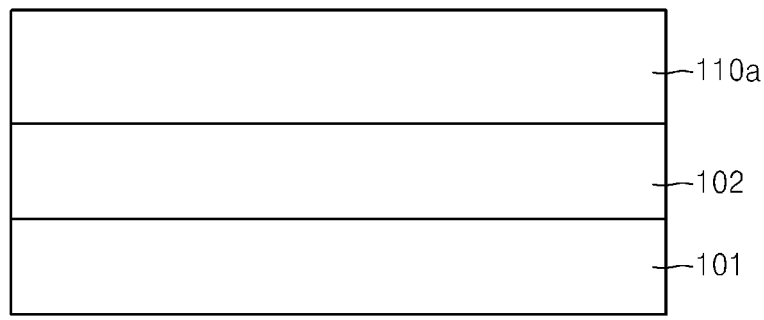
FIGS. 8A through 8I are side sectional views illustrating a method of fabricating a phase shifter, according to an embodiment of the present invention.

Referring to FIG. 8A, first, a semiconductor substrate 101, a lower insulating layer 102, and a semiconductor material layer 110a are sequentially stacked in this order. For example, the semiconductor substrate 101 may be formed of single crystalline silicon. The lower insulating layer 102 may be formed of a silicon oxide. The semiconductor material layer 110a may be formed of extrinsic silicon doped with first or second conductivity type dopant so as to have a predetermined charge carrier concentration, or undoped intrinsic silicon.

When the semiconductor substrate 101 is a Silicon On Insulator (SOI) substrate, an upper silicon layer of the SOI substrate may be used as the semiconductor material layer 110a. On the other hand, when a silicon bulk is used as the semiconductor substrate 101, the silicon bulk substrate is oxidized to form an insulating layer of silicon oxide. Amorphous silicon or polysilicon is then deposited on the insulating layer to form a single crystalline silicon using a Solid Phase Epitaxial (SPE) growth, Laser Epitaxial Growth (LEG) technique, or the like. The single crystalline silicon may be used as the semiconductor material layer 110a.

Figure 8B:
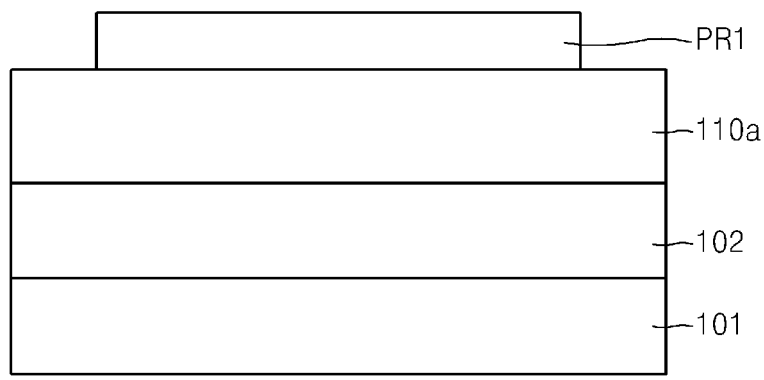
Figure 8C:
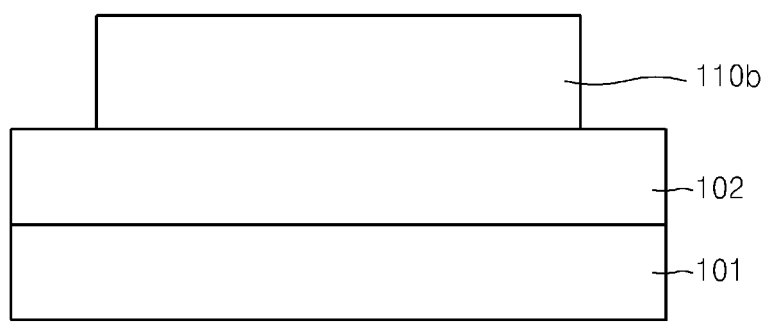

Referring to FIGS. 8B and 8C, after forming a photoresist pattern PR1 on the semiconductor material layer 110a, the semiconductor material layer 110a is etched using the photoresist mask PR1 as a mask to form a preparatory semiconductor layer 110b.

Figure 8D:
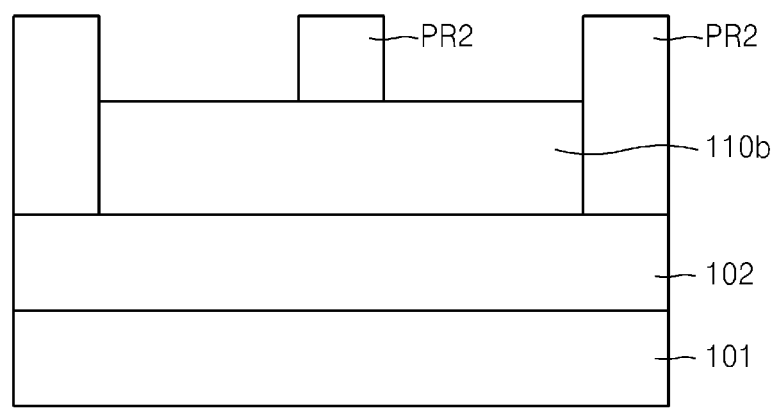
Figure 8E:
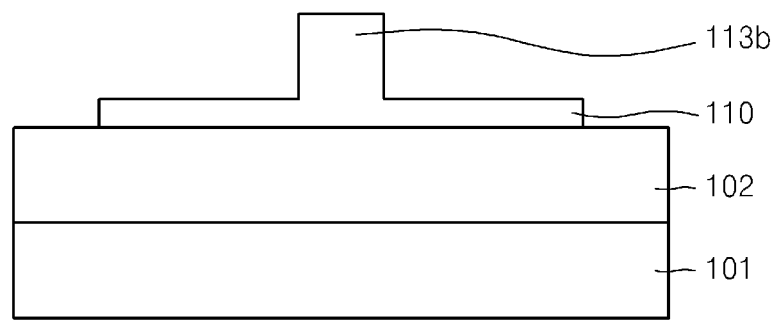

Referring to FIGS. 8D and 8E, a photoresist pattern PR2 is formed on the preparatory semiconductor layer 110b, and then exposed portions of the preparatory semiconductor layer 110b are etched using the photoresist pattern PR2 as a mask to form a semiconductor layer 110. In this case, the exposed portions of the preparatory semiconductor layer 110b are etched at different etching rates to form a structure having a central portion 113b protruding upward.

Figure 8F:
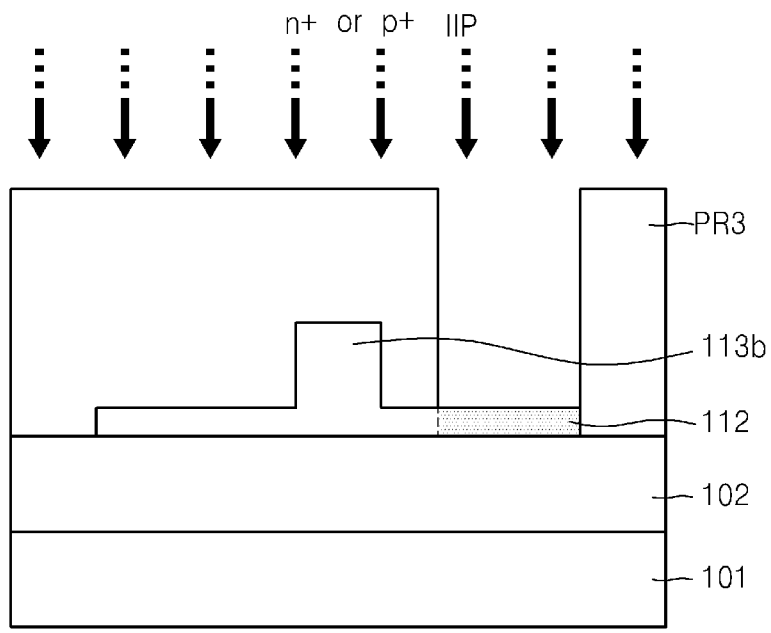

Referring to FIG. 8F, after forming a photoresist pattern PR3 on the semiconductor layer 110, a dopant of a first or second conductivity type is injected into the exposed semiconductor layer 110 using ion implantation to define a second region 112 in the semiconductor layer 110. Since an ohmic contact is formed on the second region 112 as described above, the second region 112 is doped with a higher concentration of a dopant of the first or second conductivity type to have a higher carrier concentration. Although FIG. 8F shows a higher concentration doped region of the first or second conductivity type is formed across the entire second region 112, the higher concentration doped region may be formed in the second region 112 to a predetermined depth.

Figure 8G:
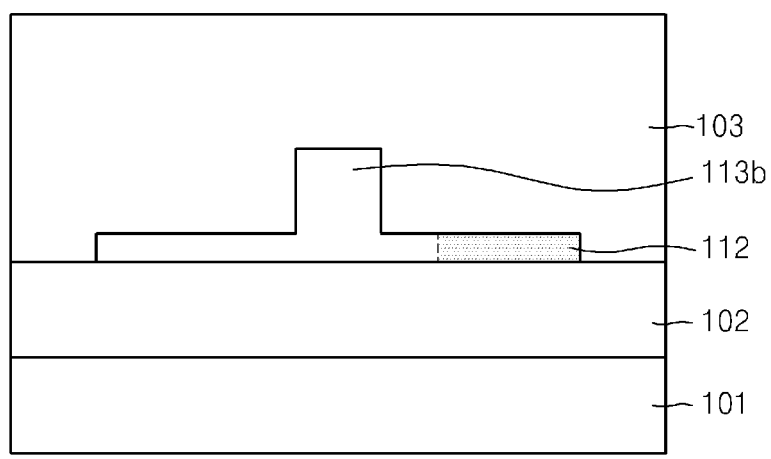
Figure 8H:
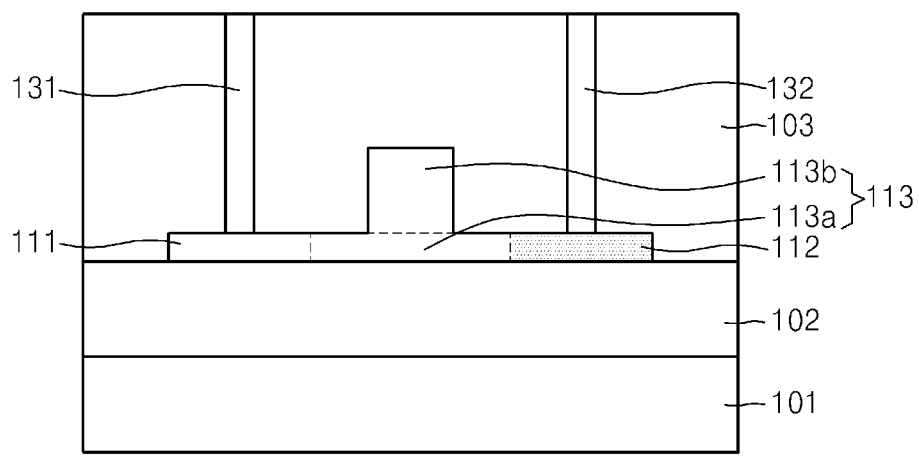

Referring to FIGS. 8G and 8H, an upper insulating layer 103 is formed to cover the semiconductor layer 110, followed by formation of a photoresist pattern (not shown) on the upper insulating layer 103. Using the photoresist pattern as a mask, exposed portions of the upper insulating layer 103 are etched to a predetermined depth to form holes for forming first and second plugs 131 and 132. When the first and second plugs 131 and 132 are partially buried into the semiconductor layer 110, the exposed portions of the upper insulating layer 103 are etched more so that the holes are recessed to a predetermined depth. Furthermore, the holes may have various shapes with the same or different widths. At least one hole may be formed in the first region 111 of the semiconductor layer 110. Next, the holes are filled with a metallic material such as aluminum, copper, or the like using chemical vapor deposition (CVD), physical vapor deposition (PVD), or atomic layer deposition (ALD), and the metallic material is planarized using chemical mechanical polishing (CMP) or etchback to form the first and second plugs 131 and 132.

Figure 8I:
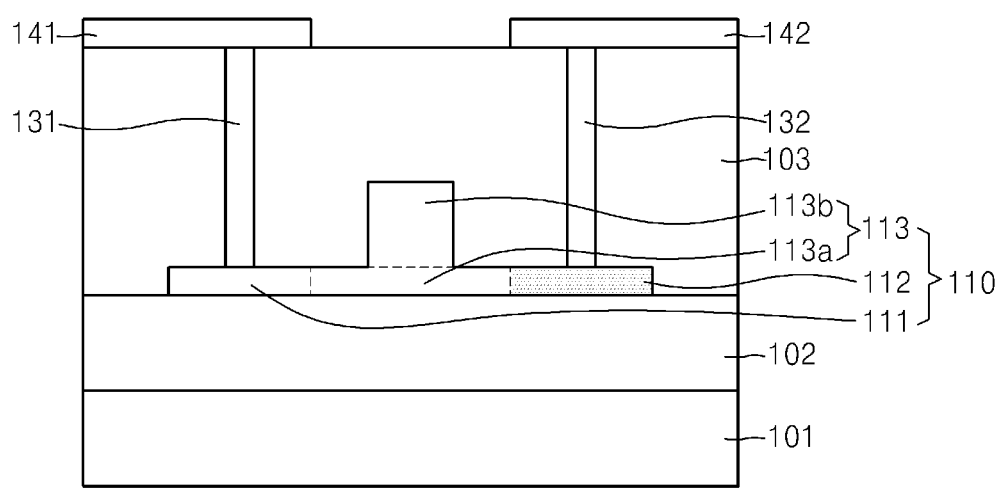

Referring to FIG. 8I, an electrode pad material layer (not shown) such as a conductive material is formed by CVD, PVD such as sputtering, and ALD, and is patterned by photolithography to form first and second electrode pads 141 and 142.

As described above, unlike an existing photonic device in which higher concentration doped regions of the first or second conductivity type are formed in the semiconductor layer so as to establish an ohmic contact structure at both electrodes, a phase shifter as a photonic device according to one or more embodiments of the present invention includes a higher concentration doped region of the first or second conductivity type only at one electrode. Thus, the manufacturing process is simplified. Omission of the additional doping reduces the number of masks necessary for a doping process, thereby efficiently reducing the manufacturing costs while improving operation speed through an electrode having a rectifying contact structure.

Figure 9:
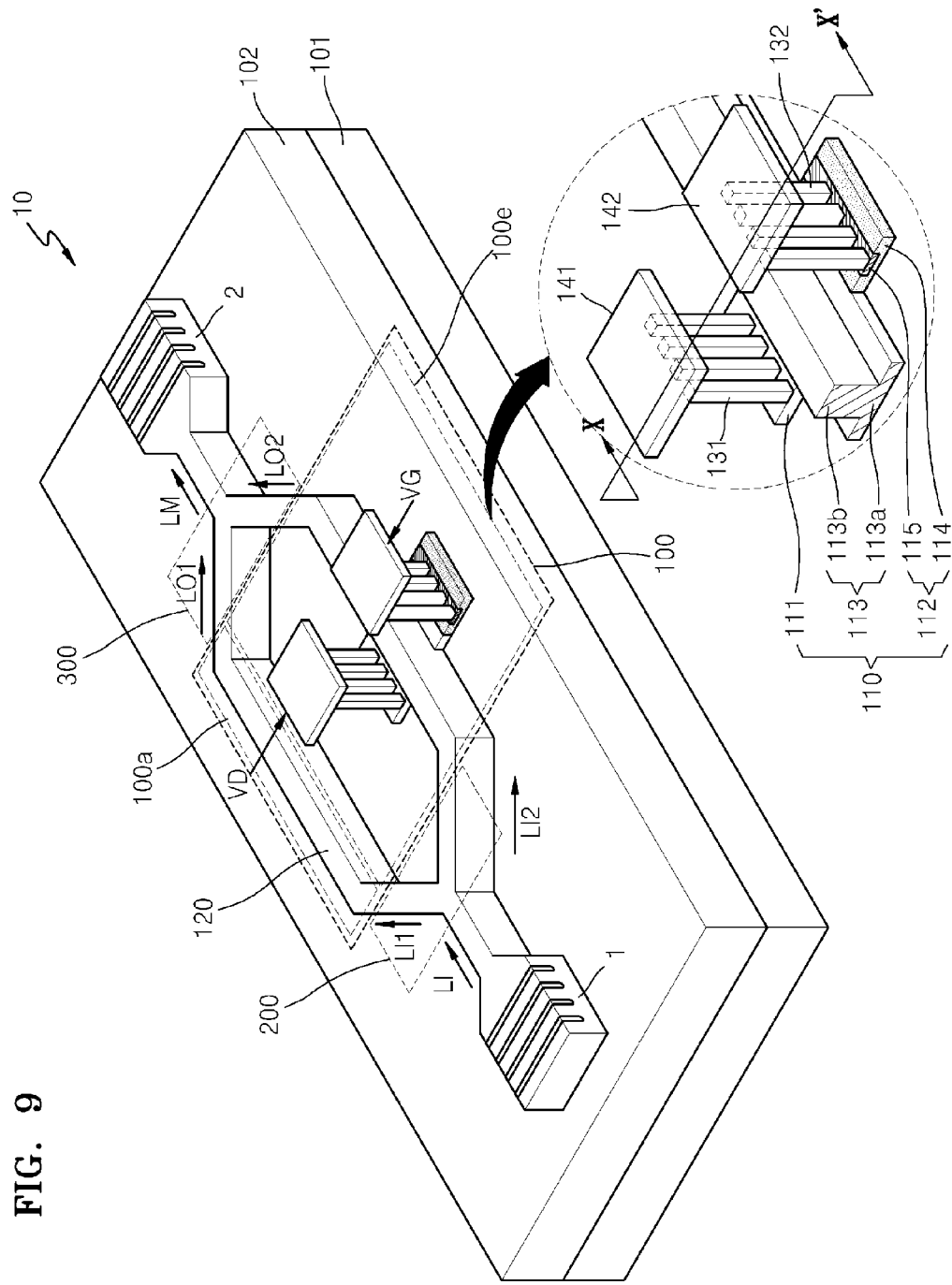
FIG. 9 is a detailed perspective view of the electro-optic modulator of FIG. 1 according to another embodiment of the present invention.
Figure 10:
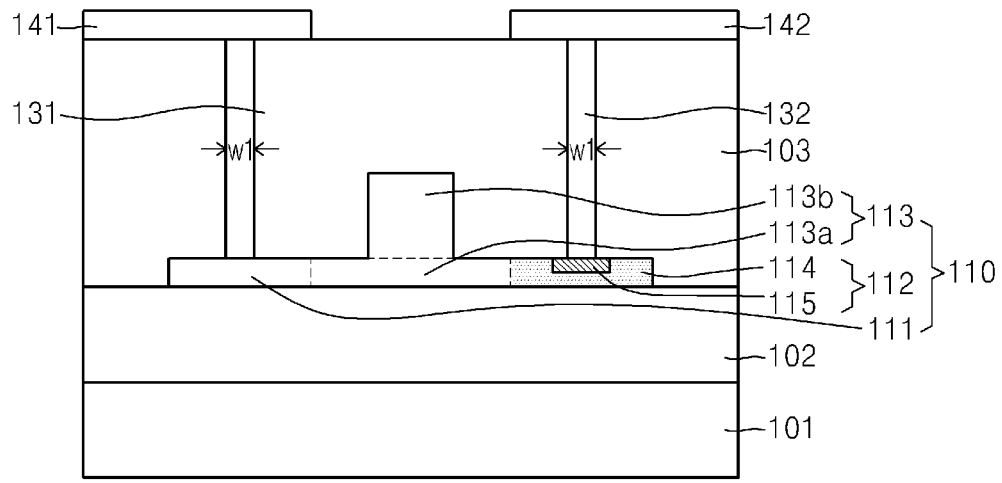
FIG. 10 is a side sectional view of a phase shifter in the phase shift unit taken along line X-X' of FIG. 9.

FIG. 9 is a detailed perspective view of the electro-optic modulator 10 of FIG. 1 according to another embodiment of the present invention. FIG. 10 is a side sectional view of a phase shifter in the phase shift unit 100 taken along line X-X' of FIG. 9. Only the difference from the construction shown in FIGS. 2, 3A, and 3B is described with reference to FIGS. 9 and 10 together with FIGS. 2, 3A, and 3B. The same reference numerals as shown in FIGS. 2, 3A, and 3B refer to identical or similar elements, and repeated descriptions with respect to FIGS. 2, 3A, and 3B are omitted to avoid redundancy.

Referring to FIGS. 2, 3A, 3B, 9, and 10, the phase shift unit 100 includes the phase maintainer 100a and a phase shifter 100e. Unlike the phase shifter 100b in which the entire second region 112 is doped with a higher concentration of a dopant of the first or conductivity type, the second region 112 in the phase shifter 100e includes first and second doped portions 114 and 115 doped with a dopant of the first or second conductivity type. More specifically, in the second region 112, the second doped portion 115 is a contact portion that is in contact with a bottom surface of the second plug 132. The first doped portion 114 corresponds to a portion of the second region 112 other than the contact portion. In this case, the second doped region 115 may have a higher charge carrier concentration than the first doped portion 114. In this way, by doping only the contact portion 115 forming an ohmic contact with higher concentration, it is possible to prevent degradation in phase shifting efficiency for an optical signal.

A method of fabricating the phase shifter 100e shown in FIGS. 9 and 10 may include adjusting the doping concentration at the step shown in FIG. 8F to form the first doped portion 114 that is a low concentration doped region of the first or second conductivity type. The method further includes forming the holes for forming the first and second plugs 131 and 132, masking the hole for forming the first plug 131 with a photoresist pattern, and additionally injecting dopant of the same conductivity type as that of the low concentration doped region 114 into the hole to form the second doped portion 115 that is a higher concentration doped region of the first or second conductivity type.

Although the phase shift units 100 described above have been illustrated as having a phase shifter such as phase shifters 100b-100e on one side, the phase maintainer 100a and the corresponding phase shifter may be on opposite sides. Moreover, although the phase shift units 100 have been described above as being single ended, the phase shift units 100 may be balanced. For example, in an embodiment, a phase shift unit 100 may include two phase shifters such as phase shifters 100b-100e described above with one coupled to each arm of the beam splitter 200 and beam coupler 300.

Figure 11:
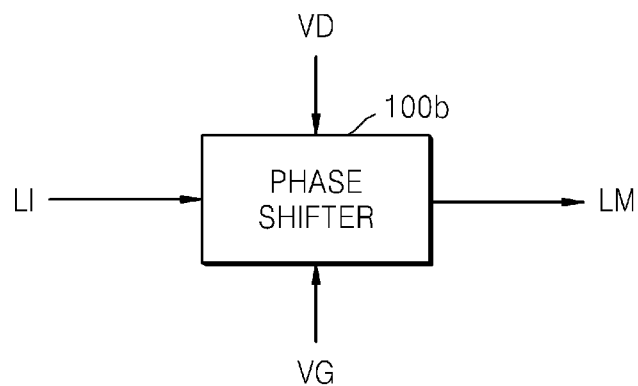
FIG. 11 is a schematic block diagram of an electro-optic modulator including a phase shifter used as a photonic device according to an embodiment of the present invention.

FIG. 11 is a schematic block diagram of an electro-optic modulator including a phase shifter used as a photonic device according to an embodiment of the present invention. In this embodiment, an electro-optic modulator 15 includes a phase shifter 100b. Although a phase shifter 100b has been used as an example, other phase shifters such as phase shifters 100c to 100e or the like may be used. Here, the phase shifter 100b is configured to receive an optical signal LI received from the outside. The phase shifter 100b is also configured to receive a modulated supply voltage VD and a ground voltage VG. In response to the modulated supply voltage VD and the ground voltage VG, the phase shifter 100b is configured to generate a phase modulated optical signal LM.

Figure 12:
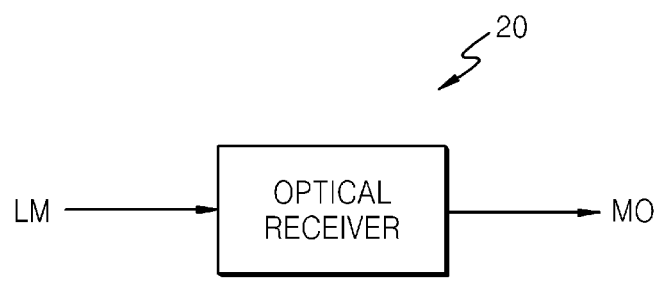
FIG. 12 is a schematic block diagram of an optical receiver including photodiodes as a photonic device according to an embodiment of the present invention.

FIG. 12 is a schematic block diagram of an optical receiver 20 including photodiodes as a photonic device according to an embodiment of the present invention.

Referring to FIG. 12, the optical receiver 20 receives an electro-optically modulated optical signal LM and restores and outputs the receiving data MO in response to the modulated optical signal LM. The optical receiver 20 may include at least one photodiode, which is described in more detail below with reference to FIGS. 13A and 13B.

Figure 13A:
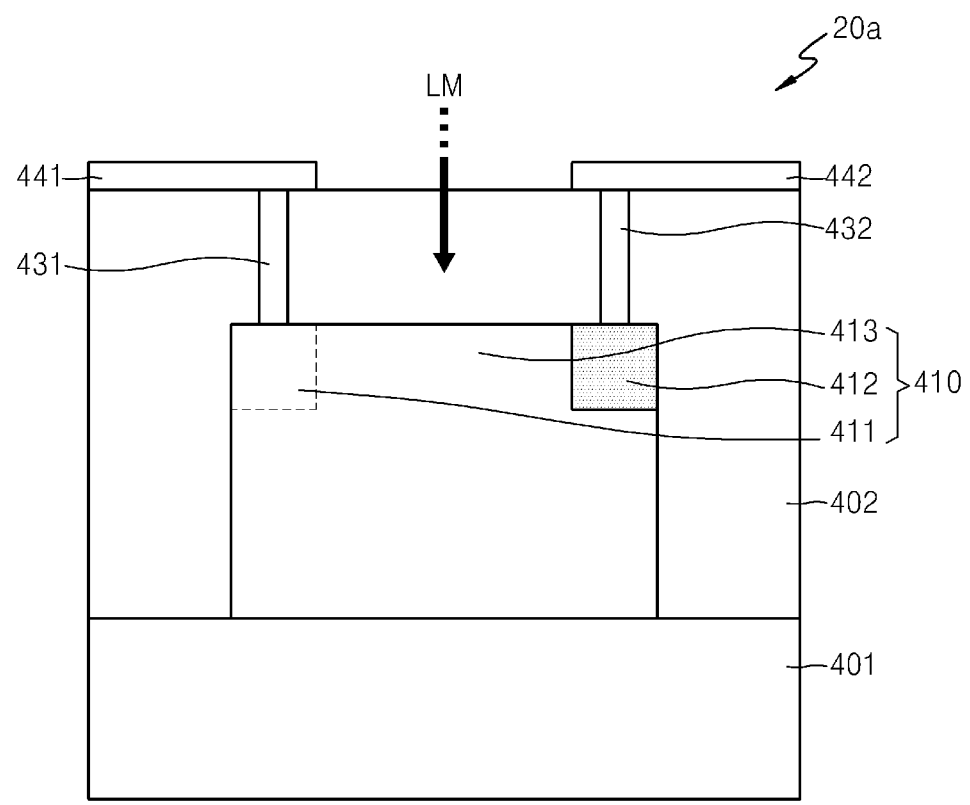
FIGS. 13A and 13B are side sectional views of photodiodes according to embodiments of the present invention.
Figure 13B:
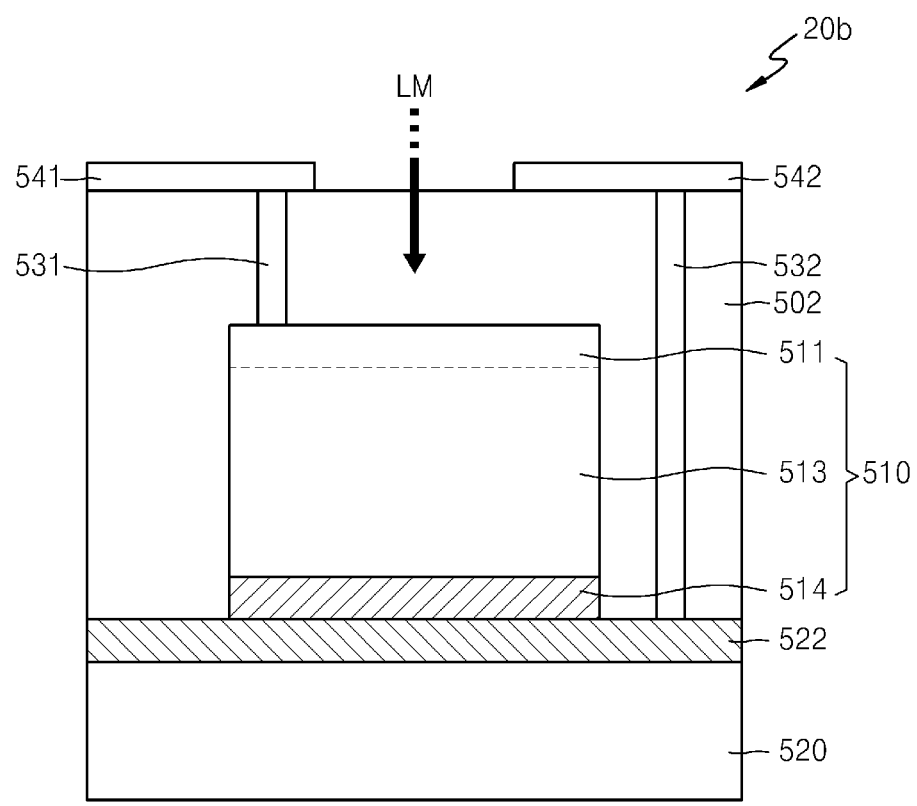

FIGS. 13A and 13B are side sectional views of a lateral photodiode and a vertical photodiode according to embodiments of the present invention, respectively. Although the photodiodes shown in FIGS. 13A and 13B are P-i-N (PIN) photodiodes, they are not limited thereto. The inventive concept of the present invention may be applied to PN photodiodes, phototransistors, photogates, and pinned photodiodes. Detailed descriptions with respect to substantially identical or similar elements are omitted.

Referring to FIGS. 12 and 13A, a photodiode having a lateral PIN structure includes a semiconductor substrate 401, a semiconductor layer 410, an insulating layer 402, first and second plugs 431 and 432, and first and second electrode pads 441 and 442. A polysilicon layer may be formed on the semiconductor layer 410, but a description thereof is omitted for convenience of explanation.

The semiconductor substrate 401 may be a silicon substrate. However, the semiconductor substrate 401 may be a SOI substrate or other substrate similar to the semiconductor substrate 101 described above.

The semiconductor layer 410 overlies the semiconductor substrate 401 and is made of a semiconductor material such as germanium (Ge). The semiconductor layer 410 may be formed of extrinsic Ge doped with a first or a second conductivity type dopant so as to have a predetermined charge carrier concentration, or undoped intrinsic Ge.

The semiconductor layer 410 may include first through third regions 411 through 413. The first region 411 may operate as an electrode through the first plug 431 and the first electrode pad 441. In particular, the first region 411 has a portion of a top surface connected to a bottom surface of the first plug 431 to form a rectifying contact therebetween. The first region 411 may be an intrinsic region when the semiconductor layer 410 is formed of Ge, or an extrinsic region maintaining a charge carrier concentration due to omission of additional doping when the semiconductor layer 410 is doped to have the predetermined charge carrier concentration. The second region 412 may operate as an electrode through the second plug 432 and the second electrode pad 442. In particular, the second region 412 has a portion of a top surface connected to a bottom surface of the second plug 431 to form an ohmic contact therebetween. The second region 412 may be doped with a higher concentration of a dopant of the first or second conductivity type. Furthermore, when the semiconductor layer 410 is doped with a dopant of the first or second conductivity type to have a predetermined charge carrier concentration, the second region 412 may be a higher concentration region additionally doped with a dopant of the same conductivity type. The third region 413 may produce charge carriers in response to the modulated optical signal LM. As the charge carriers generated from the third region 413 flow into/out of the first or second region 411 and 412, a photodiode 20a outputs an electrical signal corresponding to the modulated optical signal LM.

The insulating layer 402 may be formed of silicon oxide to cover the semiconductor layer 410. The first and second plugs 431 and 432 may be electrically coupled to the first and second electrode pads 441 and 442, respectively corresponding to the first and second regions 411 and 412 of the semiconductor layer 410. The first and second electrode pads 441 and 442 may function as a power terminal for receiving or outputting electrical signals VD and VG.

Referring to FIGS. 12 and 13B, a photodiode 20b having a vertical PIN structure includes a first layer 510, a second layer 520, an insulating layer 502, first and second plugs 531 and 532, and first and second electrode pads 541 and 542.

The second layer 520 may be a semiconductor substrate made of silicon. The first layer 510 overlies the second layer 520 and is made of a semiconductor material such as Ge. Given the characteristics of the vertical PIN structure, in order to form a diode structure between the first and second layers 510 and 520, a first region 511 making a rectifying contact with the first plug 531 is disposed at a top portion of the first layer 510, and a second region 522 making an ohmic contact with the second plug 532 disposed at a top portion of the second layer 520. Another doped region 514 having the same charge carrier concentration as the second region 522 may be formed at a bottom portion of the first layer 510 contacting the second region 522 of the second layer 520. A third region 513 is defined in the first layer 510 and produces charge carriers in response to the modulated optical signal LM. As the charge carriers generated from the third region 513 flow into/out of the first or second region 511 and 522, the photodiode 20b outputs an electrical signal corresponding to the modulated optical signal LM. Since the first and second plugs 531 and 532 and the first and second electrode pads 541 and 542 have substantially the same construction as their counterparts in FIG. 13A, detailed descriptions thereof are omitted.

The photodiodes 20a and 20b as a photonic device according to the embodiments of the present invention achieve a rectifying contact at one of two electrodes, thereby allowing higher-speed operation. The photodiodes 20a and 20b may be manufactured similar to the process described above with respect to FIGS. 8A-8I without an additional doping process for forming a higher-concentration doped region such as an ohmic contact, thereby providing easy manufacturing and low manufacturing costs.

Figure 14:
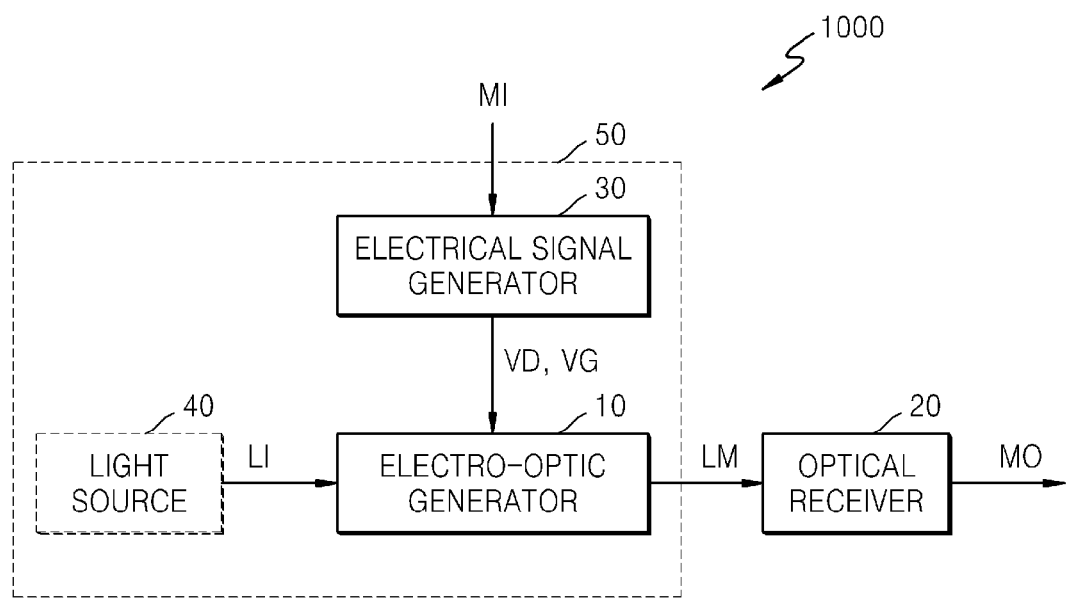
FIG. 14 is a schematic block diagram of a photonic integrated circuits (PIC) including a photonic device according to an embodiment of the present invention.

FIG. 14 is a schematic block diagram of a photonic integrated circuit (PIC) 1000 including a photonic device according to an embodiment of the present invention.

Referring to FIG. 14, the PIC 1000 includes an electro-optic modulation circuit 50 and an optical receiver 20. The electro-optic modulation circuit 50 includes an electrical signal generator 30 and an electro-optic modulator 10. The electrical signal generator 30 may generate electrical signals VD and VG based on received data MI. The electro-optic modulation circuit 50 may further include a light source 40, and the electro-optic modulator 10 is configured to modulate an optical signal LI received from the light source 40 in accordance with the electrical signals VD and VG to generate the modulated optical signal LM. The optical receiver 20 is configured to generate receiving data MO in response to the modulated optical signal LM.

Elements in the PIC 1000 may be integrated on the same semiconductor substrate such as an SOI substrate or silicon bulk substrate. When the electro-optic modulation circuit 50 further includes the light source 40, the light source 40 may be integrated within the same substrate together with other circuits or be provided separately from the other circuits.

In the PIC 1000, a phase shifter of an electro-optical modulator and a photodiode of the optical receiver 20 have a structure in which one of the two electrodes forms a rectifying contact without additional doping for forming a higher concentration doped region, thereby providing higher-speed operation, a simple manufacturing process and low manufacturing costs.

Figure 15:
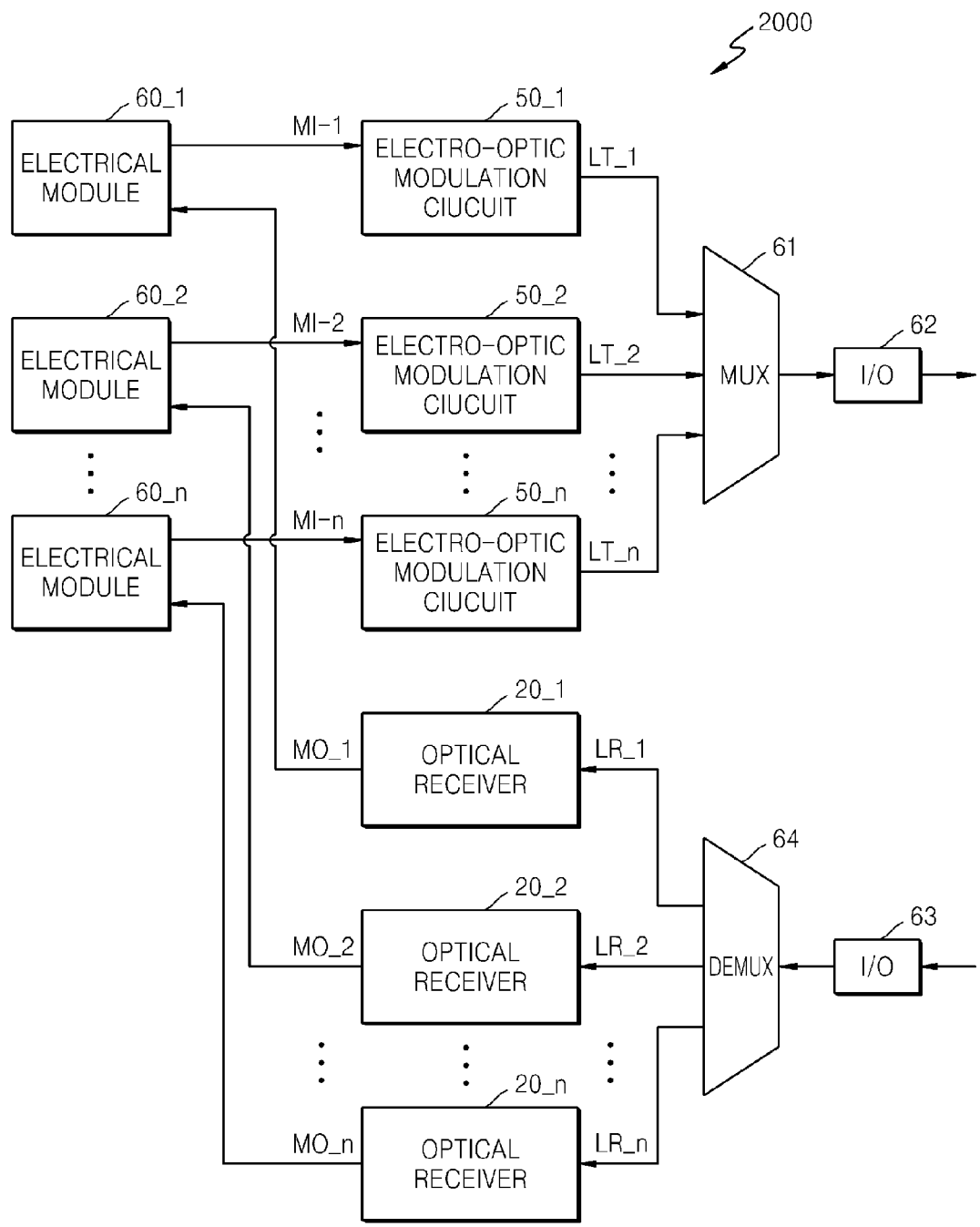
FIG. 15 is a schematic block diagram of a PIC system including a photonic device according to an embodiment of the present invention.

FIG. 15 is a schematic block diagram of a PIC system 2000 including a photonic device according to an embodiment of the present invention.

The PIC system 2000 includes a plurality of electrical modules 60_1 through 60_n, a plurality of electro-optic modulation circuits 50_1 through 50_n, an optical signal multiplexer 61, input/output (I/O)) circuits 62 and 63, a plurality of optical receivers 20_1 through 20_n, and an optical signal demultiplexer 64.

Each of the plurality of electro-optic modulation circuits 50_1 through 50_n is configured to generate a corresponding one of modulated optical transmission signals LT_1 through LT_n on the basis of a corresponding one of a plurality of pieces of transmission data MI_1 through MI_n received from the plurality of electrical modules 60_1 through 60_n. In this case, the modulated optical transmission signals LT_1 through LT_n may have different wavelengths. The optical signal multiplexer 61 is configured to use the modulated optical transmission signals LT_1 through LT_n to generate a multiplexed optical signal. The transmission I/O circuit 62 may transmit the multiplexed optical signal to an external device. The external device may be integrated in the same substrate as the PIC system 2000 or may be disposed in a different substrate to perform optical communications with the PIC system 2000 through a separate optical communication path.

The receiving I/O circuit 63 is configured to receive a multiplexed optical signal from an external device to the optical signal demultiplexer 64. The optical signal demultiplexer 64 is configured to demultiplex the multiplexed optical signal from the receiving I/O circuit 63 into a plurality of modulated received optical signals LR_1 through LR_n. In this case, the modulated received optical signals LR_1 through LR_n may have different wavelengths. The plurality of optical receivers 20_1 through 20_n are configured to generate receiving data MO_1 through MO_n modulated based on the modulated received optical signals LR_1 through LR_n and transmit the same to the plurality of electrical modules 60_1 through 60_n, respectively.

In the PIC system 2000, a phase shifter of an electro-optic modulator and photodiodes of the optical receiver according to the embodiments of the present invention may have a structure in which one of the two electrodes forms a rectifying contact without additional doping for forming a higher concentration doped region, thereby providing higher-speed operation, a simple manufacturing process, and low manufacturing costs.

The inventive concept provides a photonic device using diode-type electrodes, which allows higher-speed operation and is easily manufactured by forming a rectifying contact, i.e., Schottky junction, between semiconductor and metal at one electrode.

An embodiment includes a photonic device including: a semiconductor layer including first and second regions; an insulating layer covering the semiconductor layer; first and second electrode pads disposed on the insulating layer; and first and second plugs extending to pass through the insulating layer and electrically connecting the first and second regions with the first and second electrode pads corresponding thereto. The first plug is in a rectifying contact with the first region, and the second plug is in an ohmic contact with the second region.

In some embodiments, the semiconductor layer may further include a third region that is disposed between the first and second regions and allows charge carries to flow between the first and second regions, and the first and second regions have the same charge carrier concentration.

In some embodiments, the first and third regions may be intrinsic regions.

In some embodiments, the first and third regions may be extrinsic regions doped with dopants of a first or second conductivity type.

In some embodiments, the second region may be doped with a dopant of a first or second conductivity type, and have a higher charge carrier concentration than the first region.

In some embodiments, the second region may include a first doped region of a first or second conductivity type and a second doped region of the first or second conductivity type, and the second doped region may have a higher charge carrier concentration than the first doped region. The second plug may be in an ohmic contact with the second doped region.

In some embodiments, the first plug may have a bottom surface contacting a top surface of the first region.

In some embodiments, the first plug may have a bottom surface buried in the first region.

In some embodiments, the photonic device may include a third plug extending to pass through the insulating layer and electrically connecting the first region with the first electrode pad, and the third plug may be in a rectifying contact with the first region.

In some embodiments, the first plug may have a different width from the second plug.

In some embodiments, the semiconductor layer may further include a third region that is disposed between the first and second regions, allow charges carriers to flow between the first and second regions, and provide a path along which an optical signal moves. The first through third regions may construct a phase shifter.'

In some embodiments, the semiconductor layer may have a structure in which the third region protrudes from one side with respect to the first and second regions and may be separated from the first and second plugs.

In some embodiments, the semiconductor layer may further include a third region that is disposed between the first and second regions and generates charge carriers in response to an optical signal. The first through third regions may construct a photodiode.

An embodiment includes a photonic device including: a semiconductor layer having first and second regions; a first plug forming a rectifying contact with the first region and transmitting a first electrical signal to the semiconductor layer; and a second plug forming an ohmic contact with the second region and transmitting a second electrical signal to the semiconductor layer.

The terminology used herein is for the purpose of describing particular exemplary embodiments only and is not intended to limit the meaning thereof or the scope of the invention defined by the claims. While the inventive concept has been particularly shown and described with reference to exemplary embodiments thereof, it will be understood that various changes in form and details may be made therein without departing from the spirit and scope of the following claims. The spirit and the scope of the present invention are defined by the appended claims and equivalents thereof.

What is claimed is:

1. A photonic device comprising:
a semiconductor layer including a first region, a second region, and a third region disposed between the first and second regions;
an insulating layer covering the semiconductor layer; and
first and second plugs extending to pass through the insulating layer and electrically connected to the corresponding first and second regions;
wherein:
the third region is configured to allow charge carriers to flow between the first and second regions;
the third region includes a portion that protrudes from a surface of the first or second region;
the first plug is in a rectifying contact with the first region; and
the second plug is in an ohmic contact with the second region.

2. The photonic device of claim 1, further comprising:
first and second electrode pads disposed on the insulating layer;
wherein the first and second regions are electrically connected with the first and second electrode pads by the respective first and second plugs.

3. The photonic device of claim 1, wherein:
the first and second regions have substantially similar charge carrier concentrations.

4. The photonic device of claim 3, wherein the first and third regions are intrinsic regions.

5. The photonic device of claim 3, wherein the first and third regions are extrinsic regions doped with dopants of a first or second conductivity type.

6. The photonic device of claim 1, wherein:
the second region is doped with a dopant of a first or second conductivity type; and
the second region has a higher charge carrier concentration than the first region.

7. The photonic device of claim 1, wherein:
the second region includes a first doped region of a first or second conductivity type and a second doped region of the first or second conductivity type;
the second doped region has a higher charge carrier concentration than the first doped region; and
the second plug is in an ohmic contact with the second doped region.

8. The photonic device of claim 1, wherein at least one of the first plug and the second plug has a bottom surface contacting a top surface of the corresponding first region or second region.

9. The photonic device of claim 1, wherein at least one of the first plug and the second plug has a bottom surface buried in the corresponding first region or second region.

10. The photonic device of claim 1, further comprising:
a third plug extending to pass through the insulating layer and electrically connected to the first region;
wherein the third plug is in a rectifying contact with the first region.

11. The photonic device of claim 1, wherein the first plug has a different width from the second plug.

12. The photonic device of claim 1, wherein:
the semiconductor layer further comprises a third region that is disposed between the first and second regions, allows charges carriers to flow between the first and second regions, and provides a path along which an optical signal moves; and
the first through third regions form a phase shifter.

13. The photonic device of claim 1, wherein the semiconductor layer further comprises a third region that protrudes from one side with respect to the first and second regions and is separated from the first and second plugs.

14. The photonic device of claim 1, wherein:
the semiconductor layer further comprises a third region that is disposed between the first and second regions and is configured to generate charge carriers in response to an optical signal; and
the first through third regions form a photodiode.

15. The photonic device of claim 1, wherein:
the semiconductor layer further comprises a first layer having the first region disposed at a top portion thereof and a third region configured to generate charge carriers in response to an optical signal, and a second layer disposed below the first layer and having the second region at a top portion thereof; and
the first through third regions form a photodiode.

16. The photonic device of claim 1, wherein:
the first plug is configured to transmit a first electrical signal to the semiconductor layer; and
the second plug is configured to transmit a second electrical signal to the semiconductor layer.

17. A system, comprising:
at least one electro-optical modulator configured to modulate an optical signal to generate a modulated optical signal;
wherein each electro-optical modulator includes a phase shifter comprising:
a semiconductor layer including a first region, a second region, and a third region disposed between the first and second regions;
an insulating layer covering the semiconductor layer; and
first and second plugs extending to pass through the insulating layer and electrically connected to the corresponding first and second regions;
wherein:
the third region is configured to allow charge carriers to flow between the first and second regions;
the third region includes a portion that protrudes from a surface of the first or second region;
the first plug is in a rectifying contact with the first region and
the second plug is in an ohmic contact with the second region.

18. A method, comprising:
forming a semiconductor layer including first and second regions on a substrate;
doping the second region;
forming an insulating layer over the semiconductor layer;
forming a rectifying contact with the first region that passes through the insulating layer; and
forming an ohmic contact with the second region that passes through the insulating layer.

19. The method of claim 18, wherein:
forming the semiconductor layer comprises forming the semiconductor layer with a third region protruding from the first and second regions;

forming a pattern over the first and third regions that exposes at least part of the second region; and doping the second region after forming the pattern.

20. The method of claim 18, wherein doping the second region comprises doping the second region with a carrier concentration higher than a carrier concentration of the first region.

* * * * *